(12) United States Patent
Emori et al.

(10) Patent No.: US 11,251,162 B2
(45) Date of Patent: Feb. 15, 2022

(54) SEMICONDUCTOR DEVICE WITH REDUCED THERMAL RESISTANCE

(71) Applicant: NISSAN MOTOR CO., LTD., Yokohama (JP)

(72) Inventors: Kenta Emori, Kanagawa (JP); Tetsuya Hayashi, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 32 days.

(21) Appl. No.: 16/758,994

(22) PCT Filed: Oct. 27, 2017

(86) PCT No.: PCT/JP2017/038872
§ 371 (c)(1),
(2) Date: Apr. 24, 2020

(87) PCT Pub. No.: WO2019/082373
PCT Pub. Date: May 2, 2019

(65) Prior Publication Data
US 2021/0183823 A1 Jun. 17, 2021

(51) Int. Cl.
*H01L 25/07* (2006.01)
*H01L 23/00* (2006.01)
*H02M 7/537* (2006.01)

(52) U.S. Cl.
CPC ............ *H01L 25/072* (2013.01); *H01L 24/32* (2013.01); *H01L 2224/32105* (2013.01); *H01L 2224/32106* (2013.01); *H01L 2224/32225* (2013.01); *H01L 2224/32245* (2013.01); *H02M 7/537* (2013.01)

(58) Field of Classification Search
CPC ...................................................... H01L 27/072
USPC ........................................................ 257/773
See application file for complete search history.

(56) References Cited

U.S. PATENT DOCUMENTS

| | | |
|---|---|---|
| 2002/0195286 A1 | 12/2002 | Shirakawa et al. |
| 2010/0165680 A1 | 7/2010 | Yoshinaga |
| 2013/0075932 A1 | 3/2013 | Schwarzer et al. |
| 2014/0138850 A1 | 5/2014 | Takayama |
| 2016/0372587 A1 | 12/2016 | Tsuchiya et al. |

FOREIGN PATENT DOCUMENTS

| | | |
|---|---|---|
| JP | 9-215344 A | 8/1997 |
| JP | 2003-9546 A | 1/2003 |
| JP | 2008-228398 A | 9/2008 |
| JP | 2012-256662 A | 12/2012 |
| JP | 2013-51389 A | 3/2013 |

(Continued)

*Primary Examiner* — Thao X Le
*Assistant Examiner* — Laura M Dykes
(74) *Attorney, Agent, or Firm* — Foley & Lardner LLP

(57) ABSTRACT

The semiconductor device includes at least three semiconductor elements disposed directly or indirectly on a planar member and constituting an upper arm and a lower arm which perform ON and OFF action at mutually differential times; an upper-surface voltage applied region of each semiconductor element is configured to be narrower than an area of the aforementioned whole semiconductor element in planar view; and each semiconductor element is disposed so that the shortest distance between the semiconductor elements constituting the upper arm is formed so as to be longer than the shortest distance between the semiconductor element constituting the upper arm and the semiconductor element constituting the lower arm.

13 Claims, 8 Drawing Sheets

(56) References Cited

FOREIGN PATENT DOCUMENTS

| | | |
|---|---|---|
| JP | 2015-111633 A | 6/2015 |
| JP | 2015-141952 A | 8/2015 |
| WO | WO 2008/111544 A1 | 9/2008 |

SEMICONDUCTOR DEVICE WITH REDUCED THERMAL RESISTANCE

TECHNICAL FIELD

The present invention relates to a semiconductor device including a plurality of semiconductor elements, and in particular to a technology for reducing a thermal resistance of the semiconductor elements to suppress a heat generation.

BACKGROUND ART

For example, Patent Literature 1 discloses that, when two three-phase inverters are connected to each other in parallel, a module constituting an upper arm of one inverter and a module constituting a lower arm of the other inverter are disposed to be adjacent to each other in each phase, and the modules constituting the same arm are disposed in a staggered manner, thereby suppressing an increase in temperature of each semiconductor element constituting the inverter.

CITATION LIST

Patent Literature

Patent Literature 1: International Publication No. 2008/111544

SUMMARY OF INVENTION

Technical Problem

However, in the conventional example disclosed in Patent Literature 1 described above, since modules constituting the upper arm or lower arm are disposes so that the distance between the modules is long, but there is no mention of disposing the semiconductor elements in the same module, there is a problem that the thermal resistance could not be further reduced.

The present invention has been made in the light of the above-mentioned problem, and the object of the present invention is to provide a semiconductor device capable of further reducing the thermal resistance.

Solution to Problem

In order to achieve the above-mentioned object, the claimed invention of the present application provide a configuration, in which: a voltage applied region of each semiconductor element is configured to be narrower than an area of the aforementioned whole semiconductor element in planar view; each semiconductor element is disposed so that the shortest distance between a first semiconductor element constituting one arm of an upper arm and a lower arms and a nearest second semiconductor element constituting the one arm is longer than the shortest distance between the first semiconductor element and a nearest third semiconductor element constituting the other arm.

Advantageous Effects of Invention

The semiconductor device according to the present invention can reduce the thermal resistance.

DESCRIPTION OF EMBODIMENTS

Hereinafter, there will be described embodiments with reference to the drawings.

Description of First Embodiment

Figure 1:
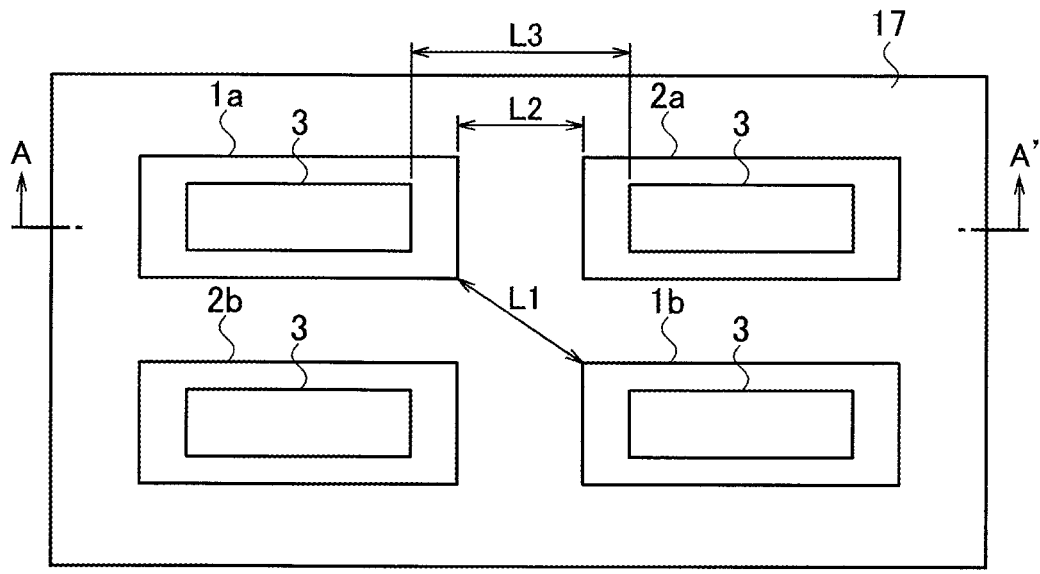
FIG. 1 is a top view diagram showing four semiconductor elements of a semiconductor device according to a first embodiment of the present invention.
Figure 2:
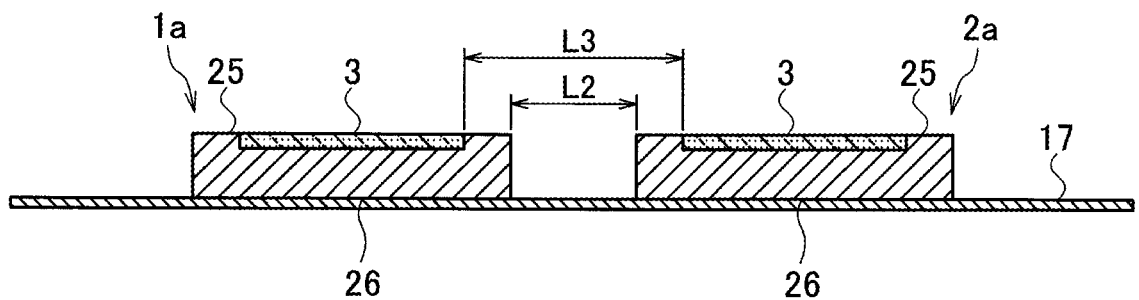
FIG. 2 is a cross-sectional diagram of the semiconductor elements shown in FIG. 1 taken in the line A-A'.
Figure 3:
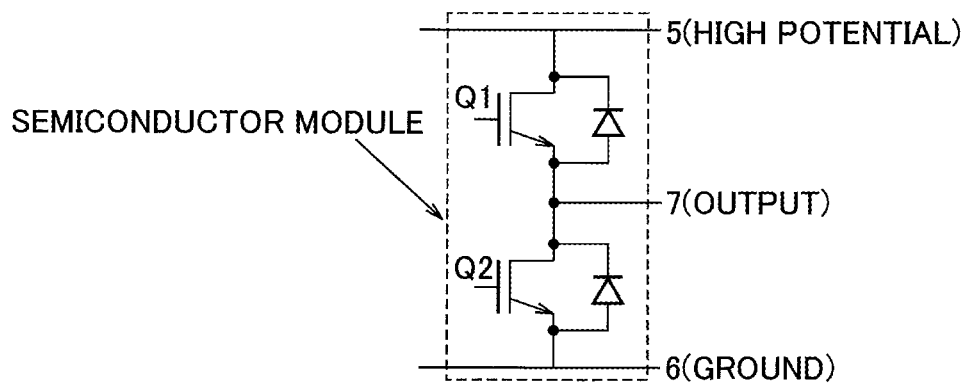
FIG. 3 is a circuit diagram showing an upper arm and a lower arm of one phase of an inverter.
Figure 4:
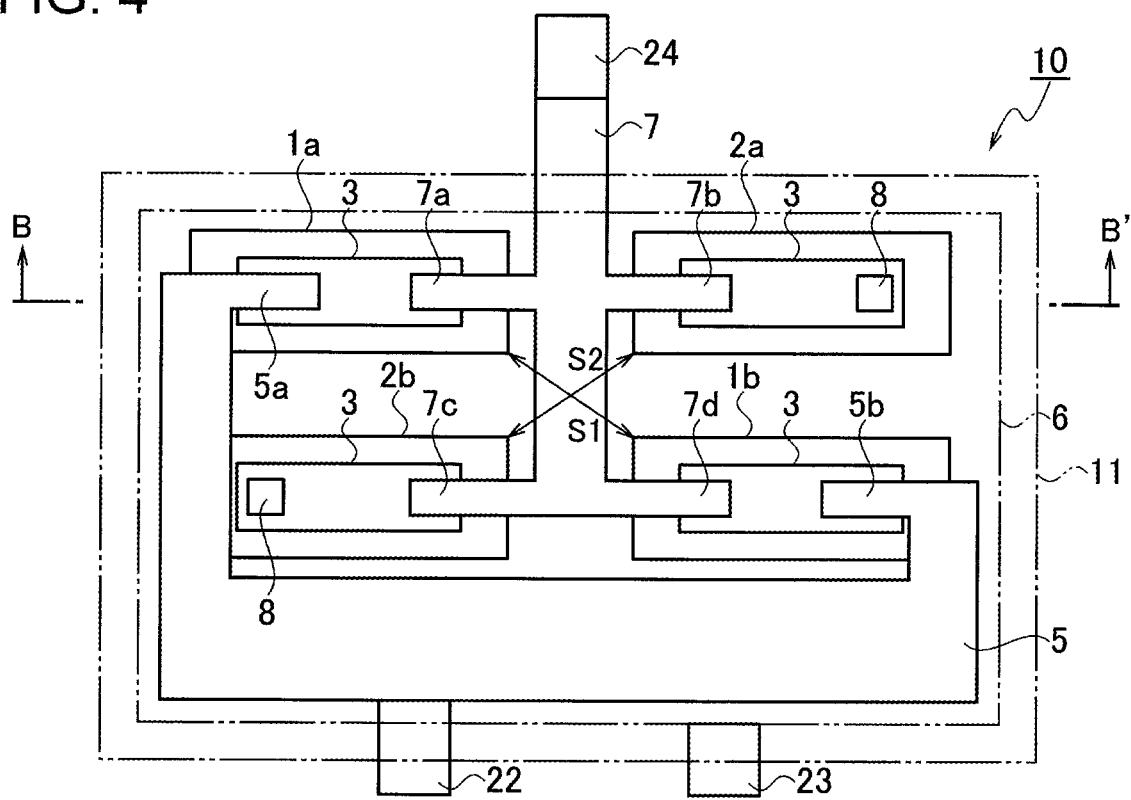
FIG. 4 is a top view diagram showing the semiconductor device according to the first embodiment.
Figure 5:
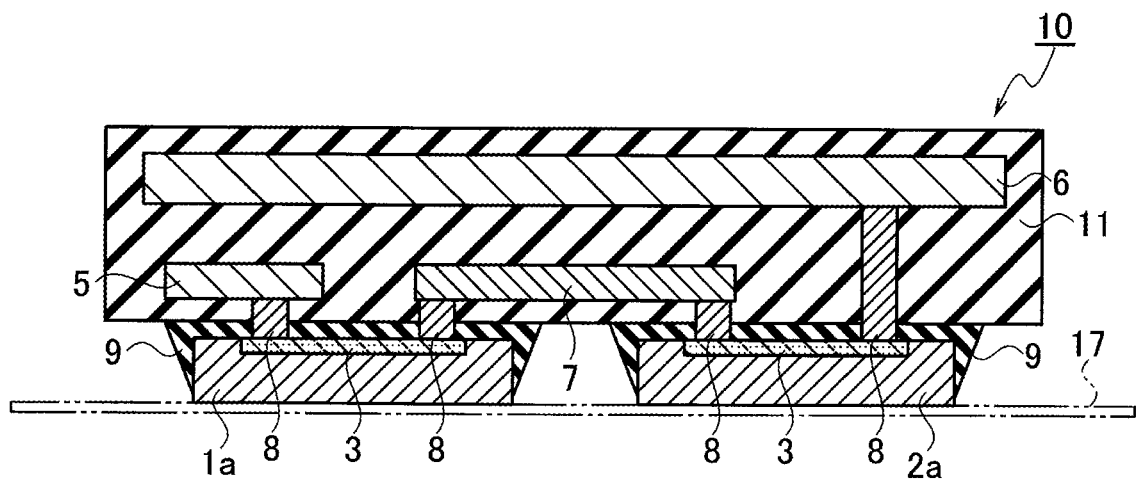
FIG. 5 is a cross-sectional diagram of the semiconductor device shown in FIG. 4 taken in the line B-B'.
Figure 6:
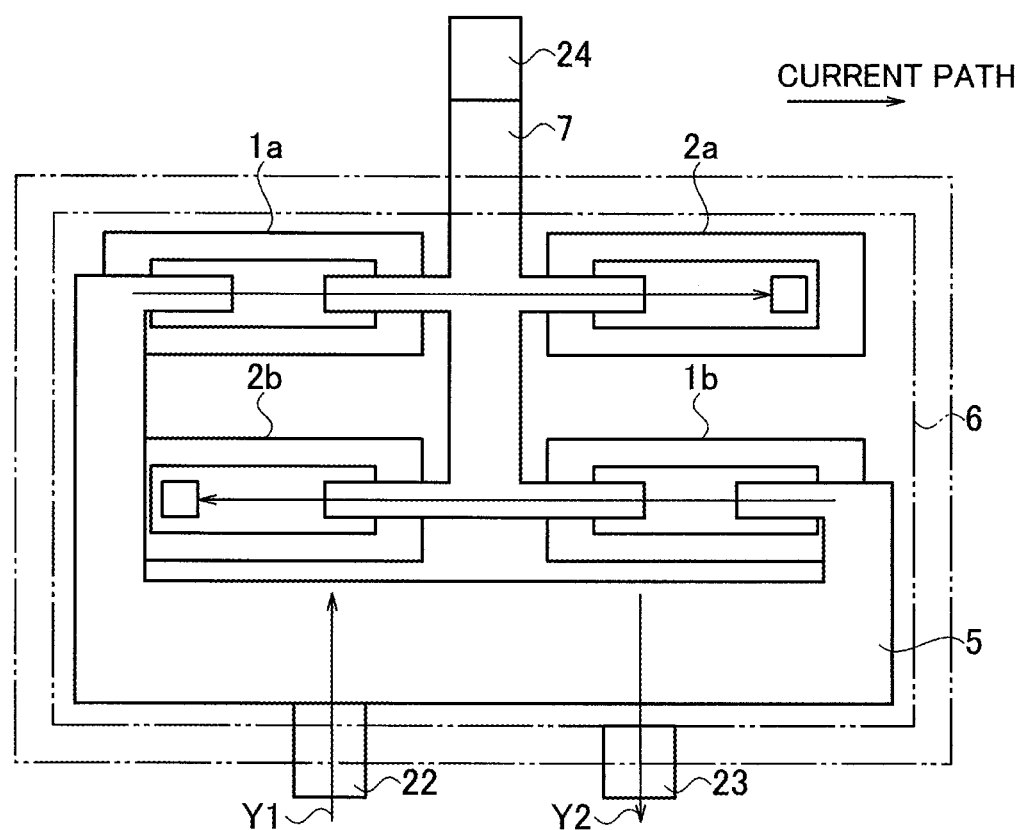
FIG. 6 is an explanatory diagram in which a direction of an electric current is written in the top view diagram showing in FIG. 4.

A first embodiment of the present invention will now be described with reference to FIGS. 1 to 6. FIG. 1 is a top view diagram showing semiconductor elements provided in a semiconductor device according to the first embodiment, FIG. 2 is a cross-sectional diagram of the semiconductor elements shown in FIG. 1 taken in the line A-A', and FIG. 3 is a circuit diagram showing an upper arm and a lower arm of one phase of an inverter. FIG. 4 is a top view diagram showing a configuration of providing a substrate including electrodes on the semiconductor elements, FIG. 5 is a cross-sectional diagram taken in the line B-B' of FIG. 4, and FIG. 6 is an explanatory diagram showing an electric current flowing between the respective electrodes.

As shown in FIG. 3, one phase of the inverter includes a MOSFET (Q1) which constitutes an upper arm and a MOSFET (Q2) which constitutes a lower arm, and the MOSFETs (Q1) and (Q2) are connected to each other in series. For example, in a three-phase inverter, three series connection circuits shown in FIG. 3 are provided.

In the first embodiment, an example will be described in which each of the MOSFETs (Q1) and (Q2) is configured by connecting two semiconductor elements in parallel. More specifically, among the four semiconductor elements shown in FIG. 1, the semiconductor elements 1a and 1b correspond to the MOSFET (Q1), and the semiconductor elements 2a and 2b correspond to the MOSFET (Q2). The MOSFETs (Q1) and (Q2) respectively perform ON and OFF actions at mutually different times. Note that, in the present embodiment, although an example of using the MOSFET as a switching element of the inverter is described, other semiconducting switches, such as an IGBT, can be used, for example. Moreover, each of the semiconductor elements shown in FIG. 1 is configured using a lateral semiconductor element in which a main electrode is provided in one principal surface and an electric current flows in a lateral direction.

As shown in FIG. 3, a drain of the MOSFET (Q1) constituting the upper arm is connected to a first main electrode 5 having a high potential such as a positive electrode of a direct current (DC) power supply (not shown), for example, and a source thereof is connected to a third main electrode 7 which is an output electrode. On the other hand, a drain of the MOSFET (Q2) constituting the lower arm is connected to the third main electrode 7, and a source thereof is connected to a second main electrode 6 having a low potential such as a negative electrode of the DC power supply. The low potential is a ground potential, for example. In other words, two upper and lower arms are connected to each other in series, and the drain of the MOSFET (Q1) which is one end of the circuit connected in series is connected to the high potential side of the DC power supply and is also connected to the first main electrode 5. Moreover, the source of the MOSFET (Q2) which is the other end thereof is connected to second main electrode 6 and is also connected to the low potential side of the DC power supply. A point to which both are connected is connected to the third main electrode 7.

The MOSFET (Q1) of the upper arm is configured by connecting two semiconductor elements 1a and 1b shown in FIG. 1 in parallel. The MOSFET (Q1) of the lower arm is configured by connecting the two semiconductor elements 2a and 2b in parallel. Naturally, each MOSFET may be configured by connecting three or more semiconductor elements in parallel, or the MOSFET (Q1) may be configured of one semiconductor element and the MOSFET (Q2) may be configured of two semiconductor elements. It is sufficient that three or more semiconductor elements are provided in the total for the upper arm and the lower arm.

As shown in FIGS. 1 and 2, four semiconductor elements 1a, 1b, 2a, and 2b are installed on an upper surface of a planar member 17 having a rectangular shape. Among these, two semiconductor elements 1a and 1b are respectively disposed at diagonal positions, and the remaining two semiconductor elements 2a and 2b are respectively disposed similarly at diagonal positions. In other words, the semiconductor elements 1a and 1b constituting the MOSFET (Q1) of the upper arm and the semiconductor elements 2a and 2b constituting the MOSFET (Q2) of the lower arm are alternately disposed with respect to each other (disposed in a staggered manner). As shown in FIG. 4, each semiconductor element is disposed so that a line S1 connecting between the semiconductor elements 1a and 1b constituting the upper arm is intersected with a line S2 connecting between the semiconductor elements 2a and 2b constituting the lower arm. Moreover, each of the semiconductor elements 1a, 1b, 2a, and 2b is disposed in contact with the planar member 17.

When the number of the semiconductor elements respectively constituting the MOSFETs (Q1) and (Q2) is three, a semiconductor element of the lower arm is provided adjacent to the semiconductor element 1b of the upper arm shown in FIG. 1, and a semiconductor element of the upper arm is provided adjacent to the semiconductor element 2b of the lower arm. That is, three semiconductor elements are alternately disposed with respect to each other. Although FIGS. 1 and 2 show examples in which each semiconductor element is directly in contact with the planar member 17, each semiconductor element may be indirectly in contact with the planar member 17 via another member.

The semiconductor elements and the planar member 17 can be connected by means of direct bonding of solder or brazing material, or indirect bonding of grease or the like. It is effective also as a configuration in which a cooling device may be provided so that heat generated from the semiconductor element can be efficiently dissipated through the planar member 17. The cooling system may be air cooling or water cooling. A configuration of attaching fins (not shown) to the planar member 17 or a configuration of directly attaching fins on an opposite principal surface 26 of the semiconductor element may be used. Furthermore, the planar member 17 may be provided at the one principal surface 25 side instead of at the opposite principal surface 26 side.

The one principal surface 25 and the opposite principal surface 26 are insulated or semi-insulated. The planar member 17 may be an insulator, or may be electrically connected to the high potential, the output potential, or the low potential (ground) as shown in FIG. 3 as a conductive member.

Furthermore, as shown in FIGS. 1 and 2, an upper-surface voltage applied region 3 which is a region where a voltage is applied is formed on a center portion on each upper surface (on the one principal surface 25) of the semiconductor elements 1a and 1b constituting the upper arm and the semiconductor elements 2a and 2b constituting the lower arm. The "voltage applied region" is the source region or drain region of the MOSFET, for example, and is a region where a DC voltage is applied from the DC power supply and an electric current flows. When the MOSFET operates, an electric current flows to the voltage applied region, thereby generating heat. Each semiconductor element is a lateral semiconductor element in which the voltage applied region is formed only on the upper surface. Then, the electric current flows in a lateral direction (horizontal direction), and performs a switching operation and a reflux operation.

The area of the upper-surface voltage applied region 3 is smaller than the area of the whole semiconductor element in planar view. In other words, the upper-surface voltage applied region 3 of the semiconductor element which is a region where the voltage is applied is configured to be narrower than the area of the whole semiconductor element in planar view from the normal direction of the planar member 17.

Moreover, as shown in FIG. 4, the upper-surface voltage applied region 3 of each semiconductor element is connected to at least two electrodes of the above-described first main electrode 5, second main electrode 6, and third main electrodes 7. Moreover, as shown in FIG. 2, the opposite principal surface 26 of each semiconductor element is in contact with the planar member 17. Although an illustration is omitted, the second main electrode 6 may electrically be connected with the planar member 17.

In addition, a semiconductor element as a different element that performs only the switching operation or only the reflux operation may be used for each semiconductor element. Alternatively, a semiconductor element which can perform both of the switching operation and the reflux operation may be used.

The semiconductor element is preferable to have a MOS structure or an HEMT structure. Moreover, it is preferable as materials of the semiconductor element is made of silicon (Si), silicon carbide (SiC), gallium nitride (GaN), others, or a combination thereof.

Moreover, the respective semiconductor elements constituting the same arm are alternately disposed with respect to each other, and thereby a distance between the nearest semiconductor elements constituting the same arm is longer than a distance between the nearest semiconductor elements constituting different arms. Specifically, as shown in FIG. 1, the shortest distance L1 between ends of the semiconductor elements 1a and 1b (shortest distance between the semiconductor elements of the same arm) is longer than the shortest distance L2 between ends of the semiconductor elements 1a and 2a (shortest distance between the semiconductor elements of the different arms).

In other words, each semiconductor element is disposed so that the shortest distance (L1) between the semiconductor element 1a (first semiconductor element) constituting the upper arm and the nearest semiconductor element 1b (second semiconductor element) constituting the upper arm is longer than (L1>L2) the shortest distance (L2) between the semiconductor element 1a and the nearest semiconductor element 2a (third semiconductor element) constituting the lower arm.

Moreover, the area of the upper-surface voltage applied region 3 provided on the semiconductor element is narrower than the area of the whole semiconductor element in planar view (planar view from the normal direction of the planar member 17). In other words, the upper-surface voltage applied region 3 is formed inside on the one principal surface 25 of the semiconductor element. Accordingly, the shortest distance L3 (refer to FIG. 1) between the upper-surface voltage applied region 3 mounted on the semiconductor element 1a of the upper arm and the upper-surface voltage applied region 3 mounted on the semiconductor element 2a of the lower arm is an insulation distance for both, where "L3>L2". Consequently, since the shortest distance L3 may be set in accordance with a required electric strength, it is possible to shorten the shortest distance L2 between the semiconductor elements.

Moreover, as shown in FIGS. 4 and 5, a substrate 11 is provided on the one principal surface of each semiconductor element. A semiconductor module 10 is composed of the substrate 11 and each semiconductor element. The substrate 11 is a multilayer substrate containing a first main electrode 5, a second main electrode 6, and a third main electrode 7 for connecting each semiconductor element. The substrate 11 may be formed of a printed circuit board, Low Temperature Co-fired Ceramics (LTCC), or the like, or may be provided on a printed circuit board or the like also including each terminal. FIG. 4 shows the second main electrode 6 in perspective, and omits the underfill 9 shown in FIG. 5.

As shown in FIG. 4, the first main electrode 5 provided in an outer peripheral side of the planar member 17 on which each semiconductor element is mounted, and an end 5a of the first main electrode 5 is connected to a connection portion (one connection portion) at the outer peripheral side of the semiconductor element 1a and an end 5b of the first main electrode 5 is connected to a connection portion at the outer peripheral side of the semiconductor element 1b. In other words, each of the semiconductor elements 1a and 1b has two connection portions, and the first main electrode 5 is connected to one connection portion, which is at the outer peripheral side of the planar member 17 of, the two connection portions. Moreover, the first main electrode 5 is extracted to the outside through a high-potential input terminal 22 (connecting terminal).

The third main electrode 7 is provided inside the planar member 17, and each of ends 7a to 7d of the third main electrode 7 is connected to a connection portion (the other connection portion) inside each semiconductor element. In other words, the end 7a of the third main electrode 7 is connected to the connection portion inside the semiconductor element 1a, the end 7b thereof is connected to the connection portion inside the semiconductor element 2a, the end 7c thereof is connected to the connection portion inside the semiconductor element 2b, and the end 7d thereof is connected to the connection portion inside the semiconductor element 1b. Moreover, the third main electrode 7 is extracted to the outside through an output terminal 24 (connecting terminal).

The second main electrode 6 is disposed to be substantially parallel to the first main electrode 5 and the third main electrode 7, and to cover (to overlap with) each semiconductor element from above in planar view in the normal direction of the planar member 17. Moreover, the second main electrode 6 is connected to a connection portion (one connection portion) at the outer peripheral side of the semiconductor element 2a via a connection via 8, and is connected to a connection portion at the outer peripheral side of the semiconductor element 2b via a connection via 8. Moreover, the second main electrode 6 is extracted to the outside via a low-potential input terminal 23 (connecting terminal). The main electrode and the terminal may also be formed of a single metal, or may be formed by connecting and combining a plurality of metals with solder or the like.

The high-potential input terminal 22 and the low-potential input terminal 23 are provided at the same side, and the output terminal 24 is provided at an opposite side thereto. In other words, the first main electrode 5 and the second main electrode 6 are extracted to the outside from one side of the planar member 17 having a rectangular shape, and the third main electrode 7 is extracted to the outside from the other side which is an opposite side to the one side.

The area of each main electrode 5, 6, and 7 in planar view from the normal direction of the planar member 17 is formed to be larger in order of the second main electrode 6, the first main electrode 5, and the third main electrode 7. An electric vibration and a parasitic stray capacitance can be suppressed by making the area of the third main electrode 7 relatively small. The second main electrode 6 is disposed so as to be overlapped with the first main electrode 5 and the third main electrode 7 in planar view.

As shown in FIG. 5, the upper-surface voltage applied region 3 and each main electrode 5, 6, and 7 are electrically connected to each other with solder or the like via the connection via 8. Furthermore, an underfill 9 such as a resin is filled in order to fill a gap between the connected regions, thereby ensuring insulation around the connection. Furthermore, the first main electrode 5, the second main electrode 6, the third main electrode 7, and each semiconductor element are disposed so as to be substantially parallel to one another.

As shown in FIG. 6, the first main electrode 5, the second main electrode 6, and the third main electrode 7 each have two or more current paths respectively to reach the connecting terminals. Specifically, the first main electrode 5 has two current paths, a path connected to the end 5a and a path connected to the end 5b. The second main electrode 6 has two current paths respectively connected to the two connection vias 8 shown in FIG. 6. Furthermore, the third main electrode 7 has four current paths respectively connected to four ends 7a to 7d.

Moreover, as shown in FIG. 5, the first main electrode 5, the second main electrode 6, the third main electrode 7, and each semiconductor element 1 and 2 are disposed in parallel with one another in side view in a direction parallel to the planar member 17. Furthermore, the first main electrode 5 and the third main electrode 7 are provided between the second main electrode 6 and the semiconductor element in side view.

Description of Operations of the First Embodiment

Next, effects of the semiconductor device according to the first embodiment configured as described above will now be described. As shown in FIG. 1, two semiconductor elements 1a and 1b constituting the upper arm are alternately disposed with respect to each other. Consequently, the shortest distance L1 between the semiconductor elements 1a and 1b constituting the upper arm is longer than the shortest distance L2 between the semiconductor element 1a constituting the upper arm and the semiconductor element 2a configuring the lower arm.

Figure 7A:
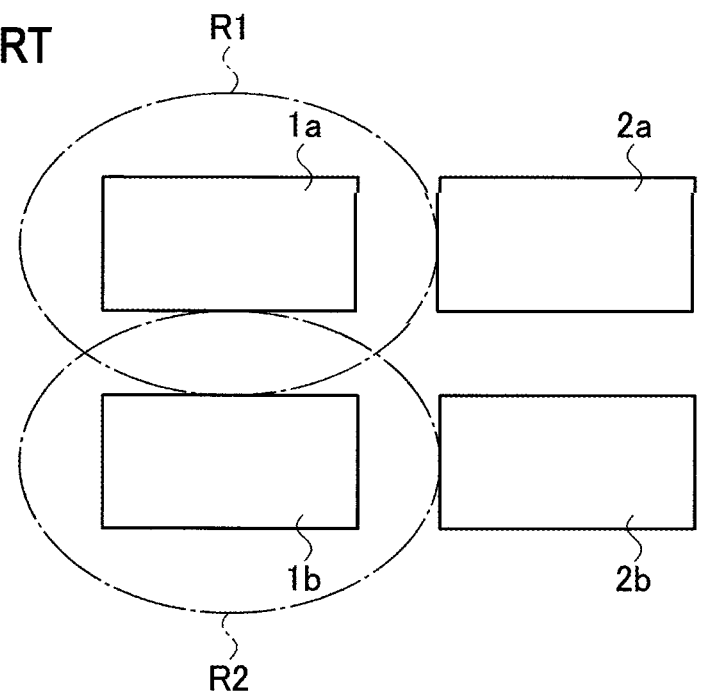
FIG. 7A is an explanatory diagram showing a thermal interference when semiconductor elements are disposed in accordance with a conventional method.

When not alternately disposing the semiconductor elements with respect to each other such as conventional case, i.e., when the semiconductor elements 1a and 1b are disposed to be adjacent to each other and the semiconductor elements 2a and 2b are disposed to be adjacent to each other as shown in FIG. 7A, an overlapping range of the heat-generating region widens, and thereby large thermal interference occurs. In other words, assuming that the heat generating regions by the semiconductor elements 1a and 1b are respectively R1 and R2, the heat generating regions R1 and R2 are overlapped with each other in a wide range, in the case of FIG. 7A. However, the heat generating regions R1 and R2 are hardly overlapped with each other, in the case of FIG. 7B. Accordingly, it is understood that the thermal interference can be reduced as compared with the conventional disposition, thereby reducing the thermal resistance. Consequently, it becomes possible to effectively dissipate the generated heat.

Moreover, as shown in FIG. 6, the high-potential input terminal 22 connected to the first main electrode 5 and the low-potential input terminal 23 connected to the second main electrode 6 are extracted from the same side of the substrate 11. Therefore, the electric current flows in the directions of arrows Y1 and Y2 in FIG. 6, and the direction of the electric current is reversed. Accordingly, a mutual inductance occurs, and a parasitic inductance can be reduced by the mutual inductance.

Figure 8:
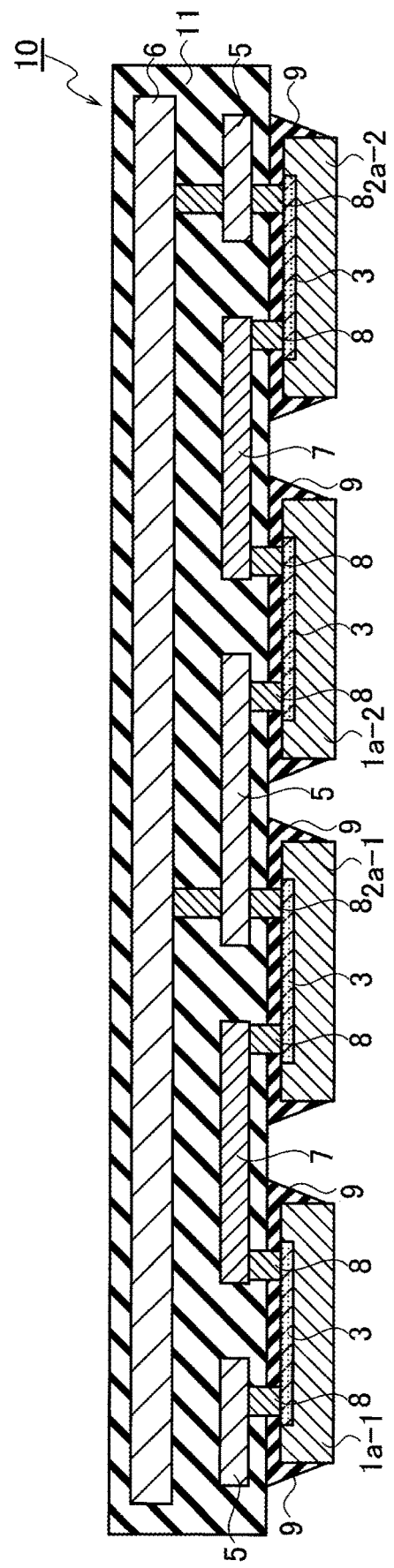
FIG. 8 is a cross-sectional diagram in a side surface direction of a semiconductor device in which semiconductor elements constituting two phases are provided on one substrate.

Furthermore, the first main electrode 5 and the second main electrode 6 can also be made common between the same arms of the two phases. FIG. 8 is a cross-sectional diagram in the side surface direction when two phases (a first phase and a second phase; e.g., U phase and V phase of U, V, and W phases) which constitute an inverter are configured by one semiconductor module. As shown in FIG. 8, the semiconductor elements 1a-1 and 2a-1 constituting the upper and lower arms of the first phase, the semiconductor elements 1a-2 and 2a-2 constituting the upper and lower arms of the second phase are disposed side by side in the lateral direction. In such a configuration, the first main electrode 5 connected to the semiconductor element 2a-1 and the first main electrode 5 connected to the semiconductor element 1a-2 are communalized. Similarly, for the second main electrode 6, the second main electrode 6 for the first phase and the second phase can be made common therebetween, by providing the connection via 8.

Description of Effects of the First Embodiment

The semiconductor element according to the first embodiment can realize the following effects.

Figure 7B:
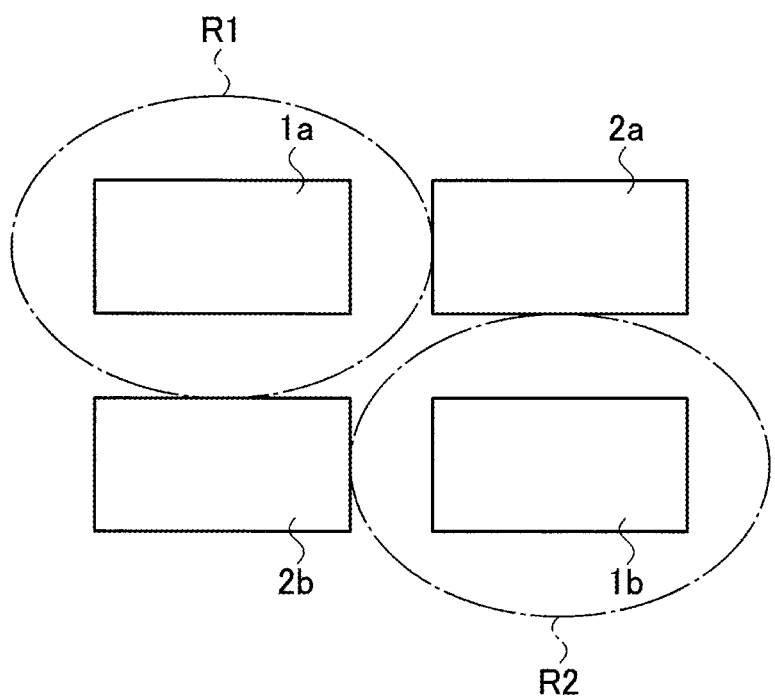
FIG. 7B is an explanatory diagram showing a thermal interference when adopting a disposition of the semiconductor elements according to the first embodiment.

(1) Since the semiconductor elements 1a and 1b constituting the upper arm and the semiconductor elements 2a and 2b constituting the lower arm are alternately disposed with respect to each other, the shortest distance between the semiconductor elements constituting the same arm can be increased without changing the area of the semiconductor elements. Therefore, as shown in FIG. 7B, the thermal interference can be reduced, and thereby the heat generation of the semiconductor device can be suppressed.

Since the area of the upper-surface voltage applied region 3 (voltage applied region) is formed to be narrower than the area of the whole semiconductor element in planar view (L3>L2 in FIG. 1), the shortest distance L2 between the elements of the upper and lower arms can be shortened if the shortest distance L3 for insulating can be secured. Therefore, the size of the semiconductor device can be further reduced.

In other words, conventionally, even if the distance between the semiconductor elements between the upper and lower arms is reduced by sacrificing the thermal resistance in order to reduce the size, since the size of the opposite principal surface (back side surface) of the power semiconductor element having a vertical structures, such as IGBT and MOSFET, is equal to the chip size of the elements, the distance between the semiconductor elements between the upper and lower arms cannot be reduced more than the required insulation distance. However, in the present embodiment, the distance between the elements between the upper and lower arms can be made equal to or less than the insulation distance, thereby the size can be further reduced. Accordingly, in the present embodiment, it is possible to realize both of the reduction in the thermal interference and the reduction in the size.

(2) The line connecting between the semiconductor elements 1a and 1b constituting the upper arm is intersected with the line connecting between the semiconductor elements 2a and 2b constituting the lower arm. Accordingly, the shortest distance between the semiconductor elements constituting the same arm can be increased without increasing the area of the semiconductor module 10. Therefore, the thermal interference generated between the semiconductor elements can be reduced, and thereby the thermal resistance can be reduced.

(3) Since all the semiconductor elements are lateral semiconductor element, the opposite principal surface 26 of each semiconductor element can be insulated from the upper-surface voltage applied region 3, and all semiconductor elements can be aligned on the same plane on the planar member 17. Therefore, simplification and miniaturization can be realized, and thereby integration is easy. Moreover, the flexibility of a layout of electric connection such as wiring is increased by aligning the direction of the surface of the semiconductor element on which the upper-surface voltage applied region 3 is formed. Moreover, the heat generated in each semiconductor element can be efficiently dissipated through the planar member 17, and thereby heat generation of the semiconductor device can be suppressed.

(4) A shielding effect can be obtained by setting the planar member 17 to the same potential as the second main electrode 6. Moreover, in a semiconductor element having a problem of a current collapse in an HEMT structures, such as GaN, it can play a function of electrolytic relaxation and the problem of the current collapse can reduced.

(5) By using a semiconductor element which can operate in bidirectional such as a MOS structure or an HEMT structure, it is not necessary to use two types of elements such as an IGBT+diode. Moreover, it is possible to provide a small-sized and low-loss semiconductor device by using a semiconductor element using a wideband gap semiconductors, such as SiC or GaN.

(6) Since the electric current flowing into the first main electrode 5 having a high potential and the second main electrode 6 having a low potential flows so as to be turned back through the semiconductor element, a mutual inductance occurs, and a parasitic inductance can be reduced by the mutual inductance.

(7) By configuring so that the area of each of the main electrodes 5, 6, and 7 is increased in order of the second main electrode 6, the first main electrode 5, and the third main electrode 7, the area of the third main electrode 7 having a potential of the output side becomes relatively small, and thereby electric vibration and parasitic stray capacitance can be suppressed.

(8) By disposing the second main electrode 6 so as to cover the first main electrode 5 and the third main electrode 7, a shielding effect can be obtained and the magnetic field strength between electrodes can further be increased. Accordingly, it is possible to reduce a parasitic inductance due to the effect of the mutual inductance.

(9) By disposing each of the main electrode 5, 6, and 7 and each of the semiconductor elements so as to be substantially parallel to one another, the mutual inductance and the magnetic field strength can be increased and thereby the reduction effect of the parasitic inductance can be improved. Consequently, a noise which occurs in the semiconductor element or third main electrode 7 can be suppressed.

(10) Since there are two or more current paths from each of the main electrodes 5, 6, and 7 to the connecting terminal, the electric current which flows through each of the main electrodes 5, 6, and 7 can be dispersed, and thereby heat generation can be reduced. Moreover, since an electric current can be flowed so as to be turned back through the semiconductor element at a plurality of places (refer to FIG. 6), it is possible to further improve the reduction effect of the parasitic inductance by the mutual inductance.

(11) The first main electrode 5 and the second main electrode 6 are connected to the connection portion at the outer peripheral side of each semiconductor element disposed on the planar member 17, and third main electrode 7 is connected to the inside connection portion. Therefore, the first main electrodes 5 of two phases adjacent to each other can be made common therebetween. As shown in the above-described FIG. 8, the semiconductor elements 2a-1 and 1a-2 are easily connected to each other with the first main electrode 5, and the first main electrode 5 can be made common therebetween. Therefore, the required area for the first main electrode 5 can be reduced, and the miniaturization of the whole device can be realized. Alternatively, since the area can be widely adopted compared with the case of one phase, the heat dissipation efficiency can be increased and it is possible to flow a larger electric current. Moreover, since the second main electrode 6 can also be made common, the effect of shielding the entire two phases and the reduction effect of the inductance can be improved. Furthermore, since the third main electrode 7 can be formed with an area smaller than that of the first main electrode 5, electric vibration and parasitic stray capacitance can be reduced.

(12) Since each of the main electrodes 5, 6, and 7 is provided in the same substrate 11, it becomes possible to integrate each of the main electrodes 5, 6, and 7 and the driving circuit. Moreover, since the wiring distance connecting between the semiconductor elements and the driving circuit can be shortened, it can operate the semiconductor element at higher speed.

(13) By using a substrate having high mass productivity such as a printed circuit board as the substrate 11, each of the main electrodes 5, 6, and 7 and the semiconductor element can be made easy to be disposed in parallel, ensuring insulating properties. Therefore, thickness reduction and miniaturization can be easily realized and general-purpose properties and mass productivity can be improved. Furthermore, since resin sealing and molding can be performed in parallel with respect to the plane of the first main electrode 5 or the second main electrode 6, it becomes possible to maintain parallelism in high accuracy with respect to the third main electrode 7. Therefore, the mutual inductance can be generated more effectively.

As described above, in the semiconductor device according to the first embodiment, it is possible to improve and simultaneously realize the trade-off of the miniaturization and the reduction in thermal resistance, and the trade-off of the reduction in inductance and the reduction in thermal resistance.

In the above-mentioned semiconductor device according to the first embodiment, various changes can be considered as described below. For example, even when positions of the first main electrode 5, second main electrode 6, and the third main electrode 7 are replaced, it is possible to obtain the effect of the parasitic inductance reduction by being arranged in consideration of neighboring conditions. Although FIG. 1 shows the configuration of the upper and lower arms of one phase in three-phase inverters and FIG. 8 shows the configuration of the upper and lower arms of two phases, the same effect can be obtained even with three or more phases.

Furthermore, if the shortest distance L3 required for the insulation between the upper-surface voltage applied regions 3 adjacent to with each other can be secured, the shortest distance L2 between the upper and lower arms may be zero, i.e., the elements between the upper and lower arms may be in contact with each other, and it is possible to reduce the thermal interference also in such a case compared with the conventional method.

Moreover, although there has been described the example in which the shape of the semiconductor elements according to the present embodiment is rectangular, and the semiconductor elements of different arms are arranged in the longitudinal direction, the same effect can be obtained even when the semiconductor elements are disposed side by side in the non-longitudinal direction of the rectangular shape. Furthermore, the same effect can be obtained even when the semiconductor element has a square shape.

Although the first embodiment shows the example of providing two semiconductor elements for each of the upper and lower arms, that is, providing a total of four semiconductor elements, the present invention is not limited to this example. The effect of reducing thermal interference can also be obtained even if the number of elements in the upper and lower arms increases or even if the number of the semiconductor elements in any of arms is one. For example, a total of nine semiconductor elements of 3 rows×3 columns may be provided, or the number of rows may be increased by fixing the number of columns of the semiconductor elements to two. It can be changed as appropriate in accordance with the requirements of the semiconductor device constituting the upper and lower arms or the layout of the inverter.

Although the present embodiment shows the example of providing each semiconductor element in contact with the same planar member 17, it may be indirectly contacted with the planar member 17 via another member. If complexity of wiring is sacrificed, even if the semiconductor elements are disposed on both of the front side surface and the back side of the planar member 17 instead of the same plane, the effect of reducing the thermal interference and reducing the thermal resistance can be obtained.

Description of Second Embodiment

Figure 9:
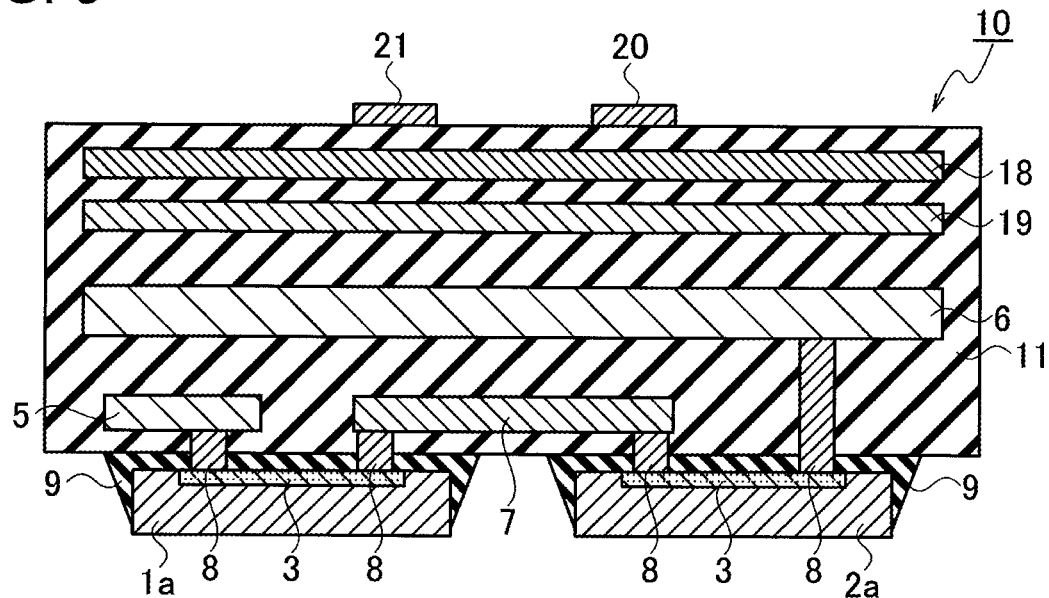
FIG. 9 is a cross-sectional diagram in a side surface direction of the semiconductor device according to the second embodiment.
Figure 10:
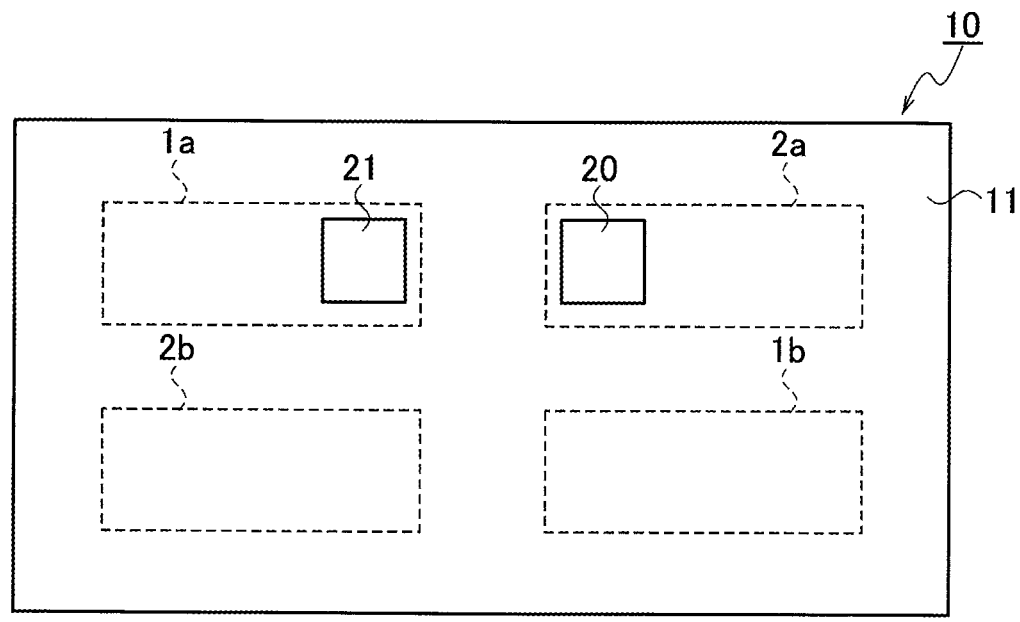
FIG. 10 is a top view diagram showing a semiconductor device according to a second embodiment.

Next, a second embodiment will now be described with reference to FIGS. 9 and 10. FIG. 9 is a cross-sectional diagram showing a semiconductor device according to the second embodiment in a side surface direction, and FIG. 10 is a top view diagram of FIG. 9. As shown in FIG. 9, the semiconductor device according to the second embodiment is different as compared with that of the first embodiment, in that a first driving circuit layer 18 and a second driving circuit layer 19 are provided in the substrate 11 and in that two driver ICs 20 and 21 are provided. The other configuration is the same as that of FIG. 5 shown in the first embodiment, and thus the same reference signs are given to the same portions and the description of such a configuration is omitted.

As shown in FIG. 9, the second driving circuit layer 19 having a flat plate shape is provided above the second main electrode 6 and also the first driving circuit layer 18 is provided thereabove, in the substrate 11. In other words, the first main electrode 5, the second main electrode 6, the third main electrode 7, and the driving circuit for driving the semiconductor element are provided in the same substrate 11.

Various driving circuits are mounted in the first driving circuit layer 18. The second driving circuit layer 19 can be ground or low potential. Moreover, on the upper surface of substrate 11, there are provided an upper-arm side driver IC 20 (first driver IC) for driving the semiconductor elements 1a and 1b constituting the upper arm, and a lower-arm side driver IC 21 (second driver IC) for driving the semiconductor elements 2a and 2b constituting the lower arm. In this case, as shown in FIG. 10, the upper-arm side driver IC 20 is provided on the upper surface of the semiconductor element 2a constituting the lower arm, and the lower-arm side driver IC 21 is provided on the upper surface of the semiconductor element 1a constituting the upper arm. That is, the semiconductor element constituting the upper arm and the lower-arm side driver IC 21 are overlapped with each other in planar view, and the semiconductor element constituting the lower arm and the upper-arm side driver IC 20 are overlapped with each other in planar view.

Moreover, also in such a configuration, the same effect as that of the above-described first embodiment can be obtained. Furthermore, the upper-arm side driver IC 20 for driving the semiconductor elements 1a and 1b of the upper arm is installed on the upper surface of the semiconductor element 2a constituting the lower arm, and thereby the distance from the upper-arm side driver IC 20 to each semiconductor element 1a and 1b can be made uniform. Similarly, the lower-arm side driver IC 21 for driving the semiconductor elements 2a and 2b of the lower arm is installed on the upper surface of the semiconductor element 1a constituting the upper arm, and thereby the distance from the lower-arm side driver IC 21 to each semiconductor element 2a and 2b can be made uniform.

According to such a configuration, since the distance from the driver IC to each semiconductor element can be made equal length and shortest, each semiconductor element driven in parallel can be operated at high speed.

As in the conventional case, there was a problem that it is difficult to form the wiring length from each semiconductor element arranged in the vertical direction or the lateral direction to the driving circuit to the center position, and the wiring length becomes uneven or becomes longer in order to uniform the wiring length. In a present embodiment, since it is possible to shorten the wiring length, and to uniform the wiring to the plurality of semiconductor elements as possible, the semiconductor elements driven in parallel can be operated at high speed.

Moreover, if configuring so that the driving circuit and each main electrode are integrated in the same substrate, and the second drive circuit layer 19 may be grounded or low potential, the weak electric current at the side of the driving circuit and the heavy current at the side of the main electrode can be separated from each other, and the shielding effect and the effect of reducing the noise level can be obtained. Moreover, the present embodiment shows the example of being configured of two layers of the first driving circuit layer 18 and the second driving circuit layer 19 as shown in FIG. 9, but it may be configured of one layer or three or more layers.

In the second embodiment described above, if the shielding effect is sacrificed, the substrate having the first driving circuit layer 18 and the second driving circuit layer 19 and the substrate having the main electrodes 5, 6, and 7 may be respectively formed as separate substrates.

Description of Third Embodiment

Figure 11:
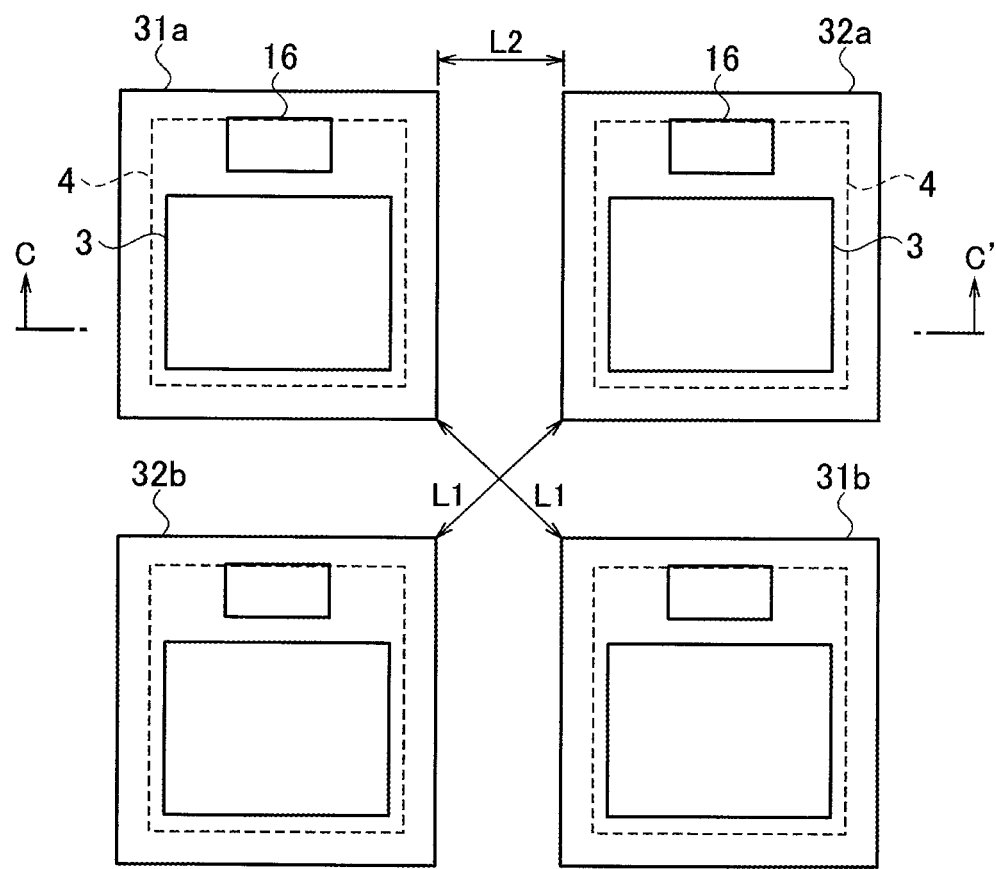
FIG. 11 is a top view diagram showing four semiconductor elements of a semiconductor device according to a third embodiment.
Figure 12A:
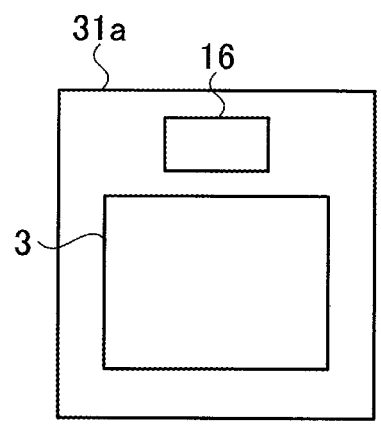
FIG. 12A is a top view diagram showing semiconductor elements according to the third embodiment.
Figure 12B:
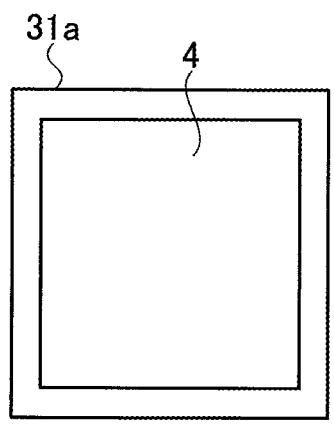
FIG. 12B is a back view diagram showing the semiconductor element according to the third embodiment.
Figure 13:
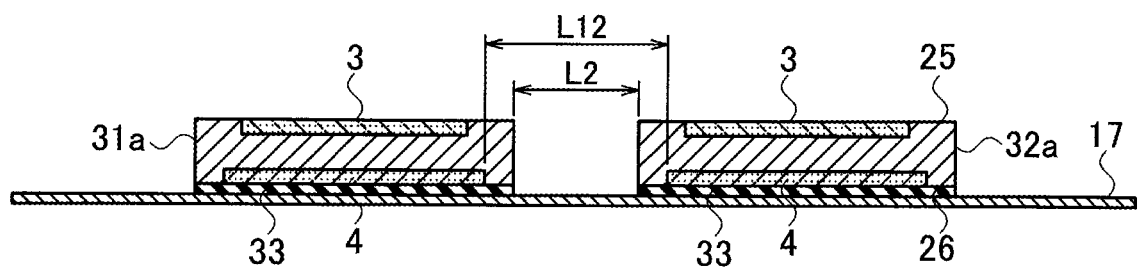
FIG. 13 is a cross-sectional diagram of the semiconductor device shown in FIG. 11 taken in the line C-C'.

Next, a third embodiment will now be described. FIG. 11 is a top view diagram showing a configuration of a semiconductor device according to the third embodiment, and FIGS. 12A and 12B are respectively a top view diagram and a back view diagram of the vertical semiconductor element used for the semiconductor device. FIG. 13 is a cross-sectional diagram taken in the C-C' of FIG. 11.

As shown in FIG. 11, the semiconductor device according to the third embodiment includes two semiconductor elements 31a and 31b constituting the upper arm and two semiconductor elements 32a and 32b constituting the lower arm, and each semiconductor element is provided on the planar member 17. Moreover, two semiconductor elements 31a and 31b are respectively disposed at diagonal positions, and the two semiconductor elements 32a and 32b are respectively disposed similarly at diagonal positions. That is, the semiconductor elements 31a and 31b constituting the upper arm and the semiconductor elements 32a and 32b constituting the lower arm are alternately disposed with respect to each other.

As shown in FIGS. 12A and 12B, a gate 16 and an upper-surface voltage applied region 3 are formed on an upper surface (on a one principal surface) of each semiconductor element 31 and 32, and a lower-surface voltage applied region 4 is formed on a back side surface thereof (opposite principal surface thereto). Each of the semiconductor elements 31 and 32 has a voltage applied region (upper-surface voltage applied region 3, lower-surface voltage applied region 4) on each of the one principal surface and the opposite principal surface, and the area of each voltage applied region 3 and 4 are narrower than the area of the semiconductor elements 31 and 32 in planar view. Moreover, an electric current flows from the one principal surface toward the opposite principal surface or from the opposite principal surface to the one principal surface. In other words, the electric current flows in a vertical direction.

FIG. 11 shows an example in which the semiconductor elements 31a and 31b constituting the upper arm and the semiconductor elements 32a and 32b constituting the lower arm are all vertical semiconductor elements. However, a configuration may be adopted in which the semiconductor element forming one of the arms is replaced with a lateral semiconductor element to combine the vertical type and lateral type semiconductor elements.

Moreover, since each of the opposite principal surface 26 of the semiconductor elements 31a and 31b which constitute the upper arm and the semiconductor elements 32a and 32b which constitute the lower arm has a lower-surface voltage applied region 4, it is necessary to insulate both. Therefore, an insulating substrate 33 is provided between the opposite principal surface 26 and the planar member 17, and thereby both is prevented from short-circuiting.

Moreover, also in the semiconductor device according to the third embodiment, the semiconductor elements 31a and 31b constituting the upper arm and the semiconductor elements 32a and 32b constituting the lower arm are alternately disposed with respect to each other on the planar member 17, as similarly to the above-described first embodiment. Accordingly, as shown in FIG. 11, the shortest distance (shortest distance between the first semiconductor element and the nearest second semiconductor element that constitutes one arm) between the semiconductor elements 31a and 31b constituting the upper arm is formed so as to be longer than the shortest distance (shortest distance between first semiconductor element and the nearest third semiconductor element that constitutes the other arm) between the semiconductor element 31a constituting the upper arm and the semiconductor element 32a constituting the lower arm. Consequently, the thermal resistance can be reduced as compared with the case where the semiconductor elements of the same arm are adjacent to each other.

Moreover, the area of the upper-surface voltage applied region 3 and the lower-surface voltage applied region 4 is formed so as to be narrower than the area of each semiconductor element 31 and 32 (area in a planar view). Therefore, as shown in FIG. 13, the insulation distance L12 which is the distance between the voltage applied regions is securely longer than the shortest distance L2 between the semiconductor elements 31a and 31b constituting the upper arm and the semiconductor elements 32a and 32b constituting the lower arm. Consequently, since the insulation distance L12 can be reduced as long as the distance between the voltage application regions can be ensured, the thermal interference can be reduced as compared with conventional example, and the miniaturization and reduction in the thermal resistance can be simultaneously realized.

Although FIG. 11 shows the example of the four semiconductor elements are vertical semiconductors, it is also possible to configure the semiconductor element constituting one of the upper arm and the lower arm as a vertical semiconductor, and to configure the semiconductor element constituting the other arm as a lateral semiconductor.

In the above-mentioned third embodiment, the shape and the disposition method of the semiconductor element are not limited to the example shown in FIG. 11, and a semiconductor element having a rectangular shape may be used, or a configuration in which three or more semiconductor elements for one arm are alternately disposed with respect to each other.

Moreover, if an element such as a MOSFET capable of bi-directionally flowing a current is used, it is not necessary to use two types of elements such as an IGBT+diode. Furthermore, it is possible to provide a more small-sized and low-loss semiconductor device by using a semiconductor element using a wideband gap semiconductors, such as SiC or GaN.

The embodiments of the present invention have been described above, as a disclosure including associated description and drawings to be construed as illustrative, not restrictive. It will be apparent to those skilled in the art from the disclosure that various alternative embodiments, examples and implementations can be made.

REFERENCE SIGNS LIST 1, 31 Upper-arm side semiconductor element
2, 32 Lower-arm side semiconductor element
3 Upper-surface Voltage Applied Region
4 Lower-surface Voltage Applied Region
5 First Main Electrode
6 Second Main Electrode
7 Third Main Electrode
8 Connection Via
9 Underfill (Resin)
10 Semiconductor Module
11 Substrate
16 Gate
17 Planar Member
18 First Driving Circuit Layer
19 Second Driving Circuit Layer
20 Upper-arm side Driver IC (First Driver IC)
21 Lower-arm side Driver IC (Second Driver IC)
22 High-potential Input Terminal
23 Low-potential Input Terminal
24 Output Terminal
25 One Principal Surface
26 Opposite Principal Surface
33 Insulating Substrate

The invention claimed is:

1. A semiconductor device comprising at least three semiconductor elements disposed on a planar member made of an insulator, the semiconductor device constituting an upper arm and a lower arm which perform ON and OFF action at mutually differential times, wherein:
an area of a voltage applied region, where a voltage is applied, of each of the semiconductor elements is narrower than an area of a whole semiconductor element in a normal direction of the planar member in planar view; and
each semiconductor element is disposed so that the shortest distance between an end of a first semiconductor element constituting one arm of an upper arm and a lower arm and an end of a nearest second semiconductor element constituting the one arm is longer than the shortest distance between an end of the first semiconductor element and an end of a nearest third semiconductor element constituting an other arm wherein
the upper arm and the lower arm are connected to each other in series, and the semiconductor device comprises:

a first main electrode connected to one end of the upper arm and the lower arm connected in series, and is connected to a high potential side of a direct current power supply;

a second main electrode connected to the other end of the upper arm and the lower arm connected in series, and is connected to a low potential side of the direct current power supply; and a third main electrode connected to a connecting point between the upper arm and the lower arm, wherein a voltage applied region of each of the semiconductor elements is connected to at least two of the first main electrode, the second main electrode, and the third main electrode, and the planar member is provided on a surface opposite to a surface on which the voltage applied region of the semiconductor element is provided, and is electrically connected to the second main electrode.

2. The semiconductor device according to claim 1, wherein the number of the semiconductor elements constituting the upper arm and the number of the semiconductor element constituting the lower arm are respectively two or more, and a line connecting between the ends of the semiconductor elements constituting the upper arm at the shortest is intersected with a line connecting between the ends of the semiconductor elements constituting the lower arm at the shortest.

3. The semiconductor device according to claim 1, wherein at least one of the semiconductor element constituting the upper arm and the semiconductor element constituting the lower arm is configured of a vertical semiconductor element.

4. The semiconductor device according to claim 1, wherein each semiconductor element is configured of only a lateral semiconductor element, and is disposed in contact on the same plane of the planar member.

5. The semiconductor device according to claim 1, wherein the planar member has a rectangular shape, the first main electrode and the second main electrode are extracted to an outside from one side of the planar member, and the third main electrode is extracted to the outside from the other side opposite to the one side.

6. The semiconductor device according to claim 1, wherein areas of the planar member of the first main electrode, the second main electrode, and the third main electrode in planar view from the normal direction are larger in order of the second main electrode, the first main electrode, and the third main electrode.

7. The semiconductor device according to claim 1, wherein the second main electrode is overlapped with the first main electrode and the third main electrode in planar view from the normal direction of the planar member.

8. The semiconductor device according to claim 1, wherein the first main electrode, the second main electrode, the third main electrode, and the semiconductor element are disposed in parallel to one another, and the first main electrode and the third main electrode are provided between the second main electrode and the semiconductor element in side view which is a direction parallel to the planar member.

9. The semiconductor device according to claim 1, wherein each of the semiconductor elements includes connection portions, and the first main electrode, the second main electrode, and the third main electrode respectively have connecting terminals for being connected to the outside of the semiconductor device, and the first main electrode, the second main electrode, and the third main electrode have two or more currents to each connecting terminal from the connection portion connected to the semiconductor element.

10. The semiconductor device according to claim 1, wherein the semiconductor element includes two connection portions, and the first main electrode and the second main electrode are connected to one connection portion at an outer peripheral side of the planar member of two connection portions, and the third main electrode is connected to the other connection portion.

11. The semiconductor device according to claim 1, wherein the first main electrode, the second main electrode, the third main electrode, and a driving circuit for driving the semiconductor element are provided in a same substrate.

12. The semiconductor device according to claim 11, wherein the substrate is configured of a printed circuit board, and the semiconductor element is provided on one surface of the printed circuit board.

13. A semiconductor device comprising at least three semiconductor elements disposed directly or indirectly on a planar member, the semiconductor device constituting an upper arm and a lower arm which perform ON and OFF action at mutually differential times, wherein:

an area of a voltage applied region, where a voltage is applied, of each of the semiconductor elements is narrower than an area of a whole semiconductor element in a normal direction of the planar member in planar view; and each semiconductor element is disposed so that the shortest distance between an end of a first semiconductor element constituting one arm of an upper arm and a lower arm and an end of a nearest second semiconductor element constituting the one arm is longer than the shortest distance between an end of the first semiconductor element and an end of a nearest third semiconductor element constituting an other arm, the semiconductor device further comprising a first driver IC configured to drive the semiconductor element constituting the upper arm, and a second driver IC configured to drive the semiconductor element constituting the lower arm, wherein the semiconductor element constituting the upper arm and the second driver IC are overlapped with each other in planar view from the normal direction of the planar member, and the semiconductor element constituting the lower arm and the first driver IC are overlapped with each other in planar view.

* * * * *